(12) United States Patent
Lee et al.

(10) Patent No.: US 11,038,667 B2
(45) Date of Patent: Jun. 15, 2021

(54) PHASE SYNCHRONIZATION DEVICE

(71) Applicant: POINT2 TECHNOLOGY, INC., Seoul (KR)

(72) Inventors: Joon Yeong Lee, Seoul (KR); Hyo Sup Won, Seoul (KR)

(73) Assignee: POINT2 TECHNOLOGY, INC.

( * ) Notice: Subject to any disclaimer, the term of this patent is extended or adjusted under 35 U.S.C. 154(b) by 0 days.

(21) Appl. No.: 16/770,780

(22) PCT Filed: Oct. 30, 2018

(86) PCT No.: PCT/KR2018/013001
§ 371 (c)(1),
(2) Date: Jun. 8, 2020

(87) PCT Pub. No.: WO2019/124721
PCT Pub. Date: Jun. 27, 2019

(65) Prior Publication Data
US 2020/0389286 A1    Dec. 10, 2020

(30) Foreign Application Priority Data

Dec. 18, 2017  (KR) .......................... 10-2017-0174436
Apr. 18, 2018  (KR) .......................... 10-2018-0044942

(51) Int. Cl.
*H04L 7/033*   (2006.01)
*H04L 27/26*   (2006.01)

(52) U.S. Cl.
CPC .......... *H04L 7/033* (2013.01); *H04L 27/2657* (2013.01)

(58) Field of Classification Search
CPC .......................... H04L 7/033; H04L 27/2657
See application file for complete search history.

(56) References Cited

U.S. PATENT DOCUMENTS

2008/0039960 A1\* 2/2008 Kadir ...................... G06F 17/18
700/73
2010/0308879 A1\* 12/2010 Ishizaki ................ H04L 7/0337
327/161
(Continued)

FOREIGN PATENT DOCUMENTS

CN      106059984 A     10/2016
EP         2330784 A1      6/2011
(Continued)

*Primary Examiner* — Qutbuddin Ghulamali
(74) *Attorney, Agent, or Firm* — Tarolli, Sundheim, Covell & Tummino LLP

(57) ABSTRACT

The present disclosure relates to a phase synchronization device, and more specifically, to a stochastic RF phase synchronization system (SRFPS) for correcting a phase error of a recovered signal on the basis of an RF signal received through a receiver. The phase synchronization device according to an exemplary embodiment of the present disclosure includes: a sampling unit for outputting a sampling value by sampling a recovered signal based on a predetermined threshold voltage value; a phase shift control unit for calculating a cost value for the recovered signal by using a histogram function generated on the basis of the sampling value, and determining an optimal phase offset value on the basis of the cost value; and a phase shift unit for shifting the phase of an oscillation signal according to the optimal phase offset value.

9 Claims, 7 Drawing Sheets

(56) References Cited

U.S. PATENT DOCUMENTS

2011/0314357 A1* 12/2011 Kondou ................ H04L 7/0029
                                                    714/775
2013/0243056 A1*  9/2013 Chmelar ................ H04L 7/033
                                                    375/224

FOREIGN PATENT DOCUMENTS

| KR | 1020030037348 A | 5/2003 |
| KR | 1020050066942 A | 6/2005 |
| KR | 1020060108015 A | 10/2006 |
| KR | 1020090089099 A | 8/2009 |
| KR | 1020150070207 A | 3/2016 |
| TW | 201740685 A | 11/2017 |

* cited by examiner

PHASE SYNCHRONIZATION DEVICE

RELATED APPLICATIONS

The present invention is a U.S. National Stage under 35 USC 371 patent application, claiming priority to Serial No. PCT/KR2018/013001, filed on 30 Oct. 2018; which claims priority of KR 10-2017-0174436, filed on 18 Dec. 2017 and KR 10-2018-0044942, filed on 18 Apr. 2018, the entirety of each are incorporated herein by reference.

TECHNICAL FIELD

The present disclosure relates to a phase synchronization device, and more particularly, to a stochastic RF phase synchronization system (SRFPS) for correcting a phase error of a recovered signal based on an RF signal received through a receiver.

BACKGROUND ART

Radio frequency (RF) communication refers to a communication technology which transfers information to a remote location using radio waves. Generally, information to be transmitted is data such as video, audio, and text, and when these are displayed as signals, they are limited to a relatively very low frequency band. As described above, the low frequency band in which an original information signal exists is called a baseband. When information in the baseband is to be transmitted without going through a transmission line, the information signal is required to be carried in a high frequency signal capable of being transmitted in the form of radio waves. This process is called modulation and high-frequency radio waves used for transportation are called carriers.

A transmitter configuring an RF communication system transmits, as an RF signal, a modulated wave whose amplitude, frequency, or phase is changed by being carried on a carrier based on a data signal to be transmitted, such as video, voice, and text. A receiver which receives the RF signal transmitted by the transmitter extracts the modulated wave from the received RF signal to restore the data signal to be transmitted by the transmitter, and this restoration process is called demodulation.

However, the phase error of the RF signal transmitted by the transmitter occurs due to environmental factors (for example, reflection of a signal by terrains and features) between the transmitter and the receiver or the influence of various elements disposed inside the transmitter and the receiver. Accordingly, it is necessary to correct the phase error included in the received RF signal when restoring the data signal at the receiver side.

FIG. 1 is a block diagram schematically illustrating a configuration of a receiver used in an RF communication system according to the related art.

Referring to FIG. 1, a receiver according to the related art includes an antenna ANT for receiving an RF signal, a low noise amplifier (LNA) 104 which minimizes noise of the received RF signal and amplifies the received RF signal, a voltage controlled oscillator (VCO) 112 which generates an oscillation signal having a predetermined frequency, and a demodulator 106 which converts the frequency of the input RF signal using the oscillation signal output from the voltage controlled oscillator 112 and the signal output from the low noise amplifier 104, and outputs an in-phase signal (hereinafter, "an I signal") and a quadrature phase signal (hereinafter, "a Q signal") having a phase difference of 90 degrees from the I signal. As is well known, the I signal and the Q signal output from the demodulator 106 have a frequency corresponding to a difference between the frequency of the RF signal input through the antenna ANT and the output frequency of the voltage controlled oscillator 112.

The demodulator 106 includes an I mixer 108 and a Q mixer 110 which receive and process the input RF signal and the oscillation signal output from the voltage controlled oscillator 112 to convert the frequency of the input RF signal. The I mixer 108 and the Q mixer 110 are composed of a transistor or the like which is turned on/off by an oscillation signal output from the voltage controlled oscillator 112 and an oscillation signal whose phase is shifted by 90 degrees by a phase shift unit 114 to convert the frequency of the RF signal, and output the I signal and the Q signal, respectively.

Meanwhile, the aforementioned phase error is included in the I signal and the Q signal output from the demodulator 106, respectively. In order to compensate for the phase error, analog-to-digital converters (ADCs) 116, 120 and digital signal processors (DSPs) 118, 122 are conventionally used, respectively. The I signal and the Q signal output from the demodulator 106 are each converted to digital signals by the ADCs 116, 120 to be input to the DSPs 118, 112. The DSPs 118, 112 compensate for the phase errors included in the I signal and the Q signal according to a predetermined specific algorithm or a signal processing method. The I signal (I) and the Q signal (Q) finally recovered by such processing are output, respectively.

As described above, when the conventional receiver illustrated in FIG. 1 is used, it is necessary to use modules such as an ADC and a DSP. There is a problem in that the power consumption of the receiver is extremely severe and the design is complicated by using the ADC and the DSP. Particularly, when the receiver illustrated in FIG. 1 demodulates the RF signal modulated by a BiPhase Shift Keying (BPSK), there is also a problem in that a separate quadrature phase signal is required to compensate for the phase error.

FIG. 2 is a block diagram schematically illustrating a configuration of another receiver used in an RF communication system according to the related art.

Referring to FIG. 2, a receiver according to the related art includes an antenna ANT for receiving an RF signal, a voltage controlled oscillator 208 which generates the RF signal and an oscillation signal having a predetermined frequency, a first mixer 202 and a second mixer 204 which convert the frequency of the input RF signal using the oscillation signal output from the voltage controlled oscillator 208 and an oscillator signal whose phase is shifted by 90 degrees by a phase shift unit 206, low pass filters 212, 214 which filter and output only a signal in a band lower than a specific frequency among the signals output from the first mixer 202 and the second mixer 204, a multiplier 216 which outputs a value proportional to the product of two signals output from the low pass filters 212, 214, and a loop filter 210 which filters the signal output from the multiplier 216. The oscillator 208 generates an oscillation signal based on a signal output from the loop filter 210. A demodulation method according to the configuration illustrated in FIG. 2 is called a Costas Loop.

According to the related art illustrated in FIG. 2, the phase error of the RF signal may be compensated without using the ADC or the DSP. However, the Costas Loop type receiver illustrated in FIG. 2 has a problem in that a hardware design is very complicated. Further, even if the demodulation method illustrated in FIG. 2 is used, there is a problem in that a separate quadrature phase signal is still required for compensating for the phase error.

DISCLOSURE

Technical Problem

An object of the present disclosure is to provide a phase synchronization device which may design a simpler receiver while reducing the power consumption of the receiver as compared to the related art.

Further, another object of the present disclosure is to provide a phase synchronization device which does not require a separate quadrature phase signal to compensate for a phase error in the process of restoring an RF signal.

The objects of the present disclosure are not limited to the aforementioned objects, and other objects and advantages of the present disclosure not mentioned may be understood by the following description, and more clearly understood by the exemplary embodiments of the present disclosure. Further, it will be readily appreciated that the objects and advantages of the present disclosure may be realized by means of the claims and combinations thereof.

Technical Solution

A phase synchronization device according to an exemplary embodiment of the present disclosure includes a sampling unit for outputting a sampling value by sampling a recovered signal based on a predetermined threshold voltage value, a phase shift control unit for calculating a cost value for the recovered signal using a histogram function generated based on the sampling value, and for determining an optimal phase offset value based on the cost value, and a phase shift unit for shifting the phase of an oscillation signal according to the optimal phase offset value.

In an exemplary embodiment of the present disclosure, the sampling unit samples the recovered signal while changing the threshold voltage value from a minimum threshold voltage value to a maximum threshold voltage value.

Further, in an exemplary embodiment of the present disclosure, the phase synchronization device further includes an accumulation unit for accumulating the number of outputs of the sampling value to generate a cumulative distribution function for the recovered signal, and the histogram is generated based on the cumulative distribution function.

Further, in an exemplary embodiment of the present disclosure, the accumulation unit accumulates the number of outputs of a predetermined cumulative target sampling value among the sampling values to generate the cumulative distribution function.

Further, in an exemplary embodiment of the present disclosure, the histogram function is generated by differentiating the cumulative distribution function.

Further, in an exemplary embodiment of the present disclosure, the phase shift control unit calculates the cost value based on the histogram function and a predetermined boundary voltage value.

Further, in an exemplary embodiment of the present disclosure, the phase shift control unit calculates the cost value using Equation 1 below:

$$W(\theta) = \int_{-V_C}^{V_C} H(v,\theta) \partial v - \alpha \int_{V_E}^{\infty} H(v,\theta) \partial v - \beta \int_{-\infty}^{V_E} H(v,\theta)$$

Equation 1

(where W refers to the cost value, θ refers to a current phase offset value applied to the recovered signal, $-V_C$ refers to a first center boundary voltage value, $V_C$ refers to a second center boundary voltage value, $-V_E$ refers to a first edge boundary voltage value, $V_E$ refers to a second edge boundary voltage value, α and β refer to predetermined constants, and H refers to the histogram function).

Further, in an exemplary embodiment of the present disclosure, the phase shift control unit determines the current phase offset value as the optimal phase offset value when the cost value calculated based on the current phase offset value is a minimum value.

Further, in an exemplary embodiment of the present disclosure, the phase shift control unit determines the optimal phase offset value while changing the current phase offset value according to a predetermined cycle.

Further, in an exemplary embodiment of the present disclosure, the recovered signal includes at least one of an I signal and a Q signal.

Advantageous Effects

According to the present disclosure, it is possible to design the simpler receiver while reducing the power consumption of the receiver as compared to the conventional receiver.

Further, according to the present disclosure, the separate quadrature phase signal is not required to compensate for the phase error in the process of restoring the wireless signal.

BEST MODE

Figure 1:
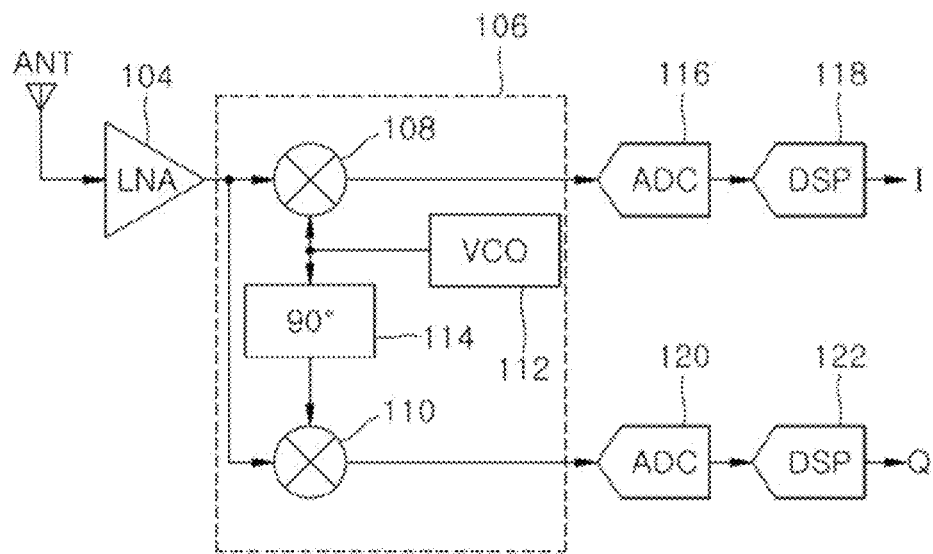
FIG. 1 is a block diagram schematically illustrating a configuration of a receiver used in an RF communication system according to the related art.

The aforementioned objects, features, and advantages will be described in detail below with reference to the accompanying drawings, and accordingly, those skilled in the art to which the present disclosure pertains may easily carry out the technical spirit of the present disclosure. In the description of the present disclosure, when it is determined that detailed descriptions of known technologies related to the present disclosure may unnecessarily obscure the gist of the present disclosure, the detailed descriptions will be omitted. Hereinafter, preferred exemplary embodiments of the present disclosure will be described in detail with reference to the accompanying drawings. The same reference numerals in the drawings are used to indicate the same or similar components.

Figure 3:
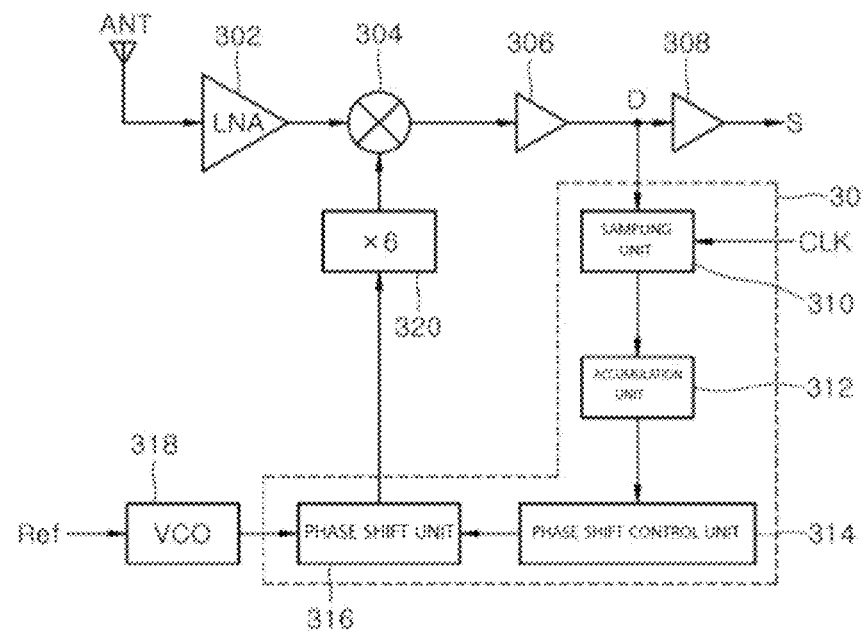
FIG. 3 is a block diagram schematically illustrating a configuration of a receiver including a phase synchronization device according to an exemplary embodiment of the present disclosure.

FIG. 3 is a block diagram schematically illustrating a configuration of a receiver including a phase synchronization device according to an exemplary embodiment of the present disclosure.

Referring to FIG. 3, the receiver according to an exemplary embodiment of the present disclosure includes a low noise amplifier 302, a mixer 304, a first buffer 306, a second buffer 308, and a phase synchronization device 30.

An RF signal received through an antenna ANT is first input to the low noise amplifier 302. The low noise amplifier 302 minimizes noise of the received RF signal, and amplifies and outputs the received RF signal. The RF signal amplified by the low noise amplifier 302 is input to the mixer 304. The mixer 304 converts the frequency of the RF signal amplified by the low noise amplifier 302 using the oscillation signal generated by a voltage controlled oscillator 318 to output a recovered signal D.

The recovered signal D output by the mixer 304 is output as a finally recovered signal S through the first buffer 306 and the second buffer 308. According to an exemplary embodiment, the first buffer 306 and the second buffer 308 may also be omitted, and the number of buffers may also vary.

The voltage controlled oscillator 318 outputs an oscillation signal having a predetermined frequency based on a reference signal (Ref) supplied from the outside. In an exemplary embodiment of the present disclosure, the phase of the oscillation signal output by the voltage controlled oscillator 318 is adjusted by the phase synchronization device 30. The oscillation signal whose phase is adjusted by the phase synchronization device 30 is input to the mixer 304 after the frequency is adjusted by a multiplier 320. According to an exemplary embodiment, a multiplication factor (for example, 6) of the multiplier 320 may vary.

Meanwhile, the phase synchronization device 30 according to the present disclosure adjusts the phase of the oscillation signal based on the recovered signal D output from the first buffer 306. The phase error included in the RF signal received through the antenna ANT is compensated by adjusting the phase of the oscillation signal by the phase synchronization device 30.

Referring to FIG. 3, the phase synchronization device 30 according to the present disclosure includes a sampling unit 310, an accumulation unit 312, a phase shift control unit 314, and a phase shift unit 316. Hereinafter, functions and operations of the phase synchronization device 30 according to the present disclosure will be described in detail with reference to FIGS. 3 to 10.

First, the sampling unit 310 outputs a sampling value by sampling the recovered signal D based on a predetermined threshold voltage value. Hereinafter, it is assumed that the sampling unit 310 is composed of a 1-bit sampling unit. The 1-bit sampling unit outputs a sampling value having a size of 1 bit, that is, 0 or 1 according to the sampling result. The sampling unit 310 may perform a sampling operation based on a clock signal CLK input from the outside.

The sampling unit 310 composed of the 1-bit sampling unit compares the voltage level of the recovered signal with the predetermined threshold voltage value, and this comparison operation is referred to as a sampling operation. For example, the sampling unit 310 outputs 1 if the voltage level of the recovered signal is larger than the threshold voltage value, and otherwise, outputs 0.

In an exemplary embodiment of the present disclosure, the sampling unit 310 may sample the recovered signal D while changing the threshold voltage value from a predetermined minimum threshold voltage value to a predetermined maximum threshold voltage value. For example, the sampling unit 310 may perform the sampling operation for the recovered signal D based on the respective threshold voltage values until reaching the maximum threshold voltage value of 100 mV while increasing the threshold voltage value from the minimum threshold voltage value of −100 mV by 10 mV.

Next, the accumulation unit 312 may generate a cumulative distribution function (CDF) for the recovered signal D by accumulating the number of outputs of the sampling values output by the sampling unit 310. In an exemplary embodiment of the present disclosure, the accumulation unit 312 may generate the cumulative distribution function by accumulating the number of outputs of a predetermined cumulative target sampling value among the sampling values output by the sampling unit 310.

Figure 4:
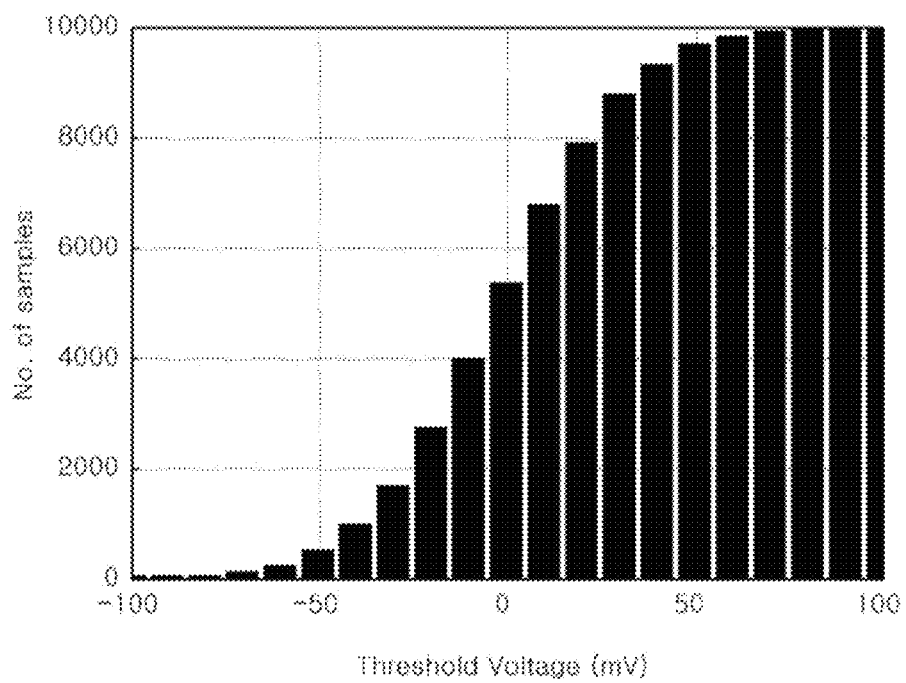
FIG. 4 is a graph illustrating an example of a cumulative distribution function (CDF) which is generated by an accumulation unit of the phase synchronization device according to an exemplary embodiment of the present disclosure.

FIG. 4 is a graph illustrating an example of a cumulative distribution function generated by an accumulation unit of a phase synchronization device according to an exemplary embodiment of the present disclosure.

FIG. 4 illustrates the cumulative distribution function which is generated by recording, for each threshold voltage value, the number of times which outputs 0, which is the cumulative target sampling value among the sampling values output as the result of performing, by the sampling unit 310, the sampling operation for the recovered signal D based on the respective threshold voltage value until reaching the maximum threshold voltage value of 100 mV while increasing the threshold voltage value from the minimum threshold voltage value of −100 mV by 10 mV. Hereinafter, a case where the cumulative target sampling value is set as '0' will be described as an example, but according to an exemplary embodiment, the cumulative target sampling value may also be set as '1'.

Figure 5:
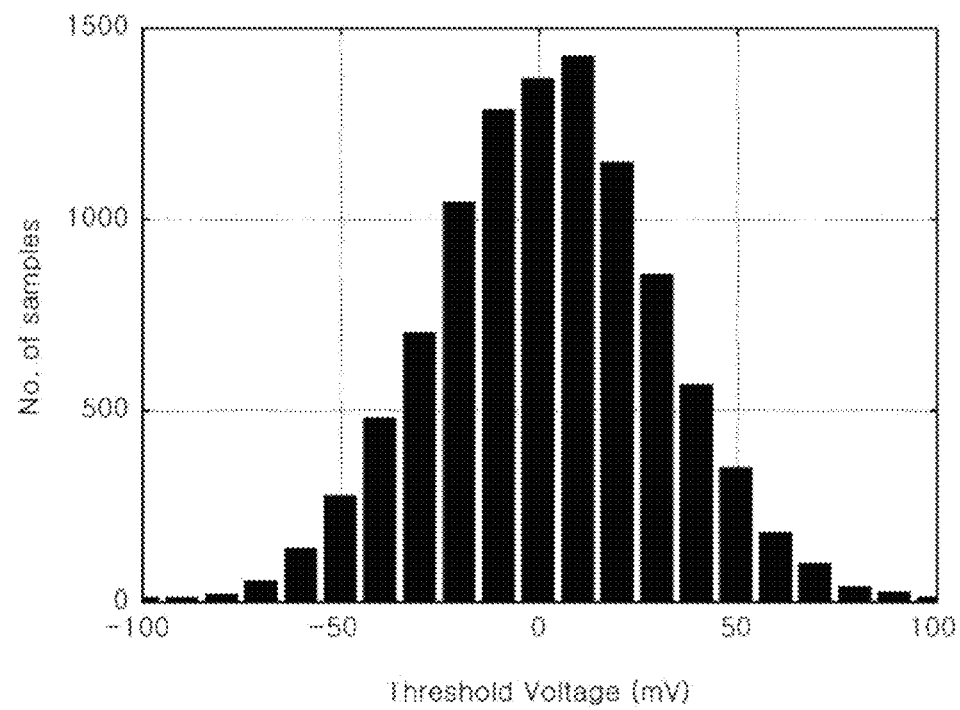
FIG. 5 is a graph illustrating a histogram function which is generated based on the cumulative distribution function illustrated in FIG. 4.

When the cumulative distribution function illustrated in FIG. 4 is generated by the accumulation unit 312, the accumulation unit 312 or the phase shift control unit 314 generates a histogram function by differentiating the cumulative distribution function. FIG. 5 is a graph illustrating a histogram function which is generated based on the cumulative distribution function illustrated in FIG. 4.

Meanwhile, in another exemplary embodiment of the present disclosure, the phase shift control unit 314 may also directly generate the histogram function illustrated in FIG. 5 using the cumulative target sampling value output from the sampling unit 310. In such an exemplary embodiment, the phase synchronization device 30 does not include the accumulation unit 312. Next, the phase shift control unit 314 determines an optimal phase offset value based on the histogram function generated previously. In the present disclosure, the optimal phase offset value means a phase offset value capable of minimizing the influence of the phase error included in the RF signal input through the antenna ANT on the finally recovered signal S.

In an exemplary embodiment of the present disclosure, the phase shift control unit 314 may calculate a cost value based on the histogram function previously generated and a predetermined boundary voltage value. Here, the boundary voltage value is a value which may be arbitrarily set to calculate the cost value, and includes a first central boundary voltage value, a second central boundary voltage value, a first edge boundary voltage value, and a second edge boundary voltage value.

More specifically, the phase shift control unit 314 may calculate the cost value of the recovered signal D according to the currently applied phase offset value using Equation 1 below.

$$W(\theta) = \int_{-V_C}^{V_C} \frac{\partial H(v,\theta)}{\partial v} \partial v - \alpha \int_{V_E}^{\infty} H(v,\theta) \partial v - \beta \int_{-\infty}^{V_E} H(v,\theta)$$

Equation 1

In Equation 1, W refers to the cost value, θ refers to the current phase offset value applied to the recovered signal D, $-V_C$ refers to the first center boundary voltage value, $V_C$ refers to the second center boundary voltage value, $-V_E$ refers to the first edge boundary voltage value, $V_E$ refers to the second edge boundary voltage value, and H refers to the histogram function previously generated. Further, α and β refer to predetermined constants, respectively, and may have values of 0 or more. According to the shape of the histogram function illustrated in FIG. 5, only any one of α and β may also be set as 0, and α and β may also be set as different values.

According to Equation 1, the cost value W according to the present disclosure may be defined as a value obtained by subtracting an integral value of both edge portions (at least one of an integral value between −∞ and the first edge boundary voltage value ($-V_E$) and an integral value between the second edge boundary voltage value ($V_E$) and ∞) from an integral value between the first central boundary voltage value ($-V_C$) and the second central boundary voltage value ($V_C$) of the histogram illustrated in FIG. 5.

The phase shift control unit 314 compares the cost value (W(θ)) for the current phase offset value (θ) applied to the recovered signal D calculated by Equation 1 with the cost value (W(θ')) calculated based on a previous phase offset value (θ'). As the comparison result, the phase shift control unit 314 determines the phase offset value which causes the cost value to have the minimum value as the optimal phase offset value.

For this comparison, the phase shift control unit 314 may continuously change the phase offset value applied to the oscillation signal by the phase shift unit 316, that is, the current phase offset value according to a predetermined cycle even after the optimal phase offset value is determined. The phase shift control unit 314 may continuously detect the optimal phase offset value by comparing the cost value according to the thus changed current phase offset value with the previously calculated cost value.

As described above, the phase shift control unit 314 according to the present disclosure determines the optimal offset value based on the cost value because the cost value is changed according to the phase offset value due to the phase error included in the RF signal.

Figure 6:
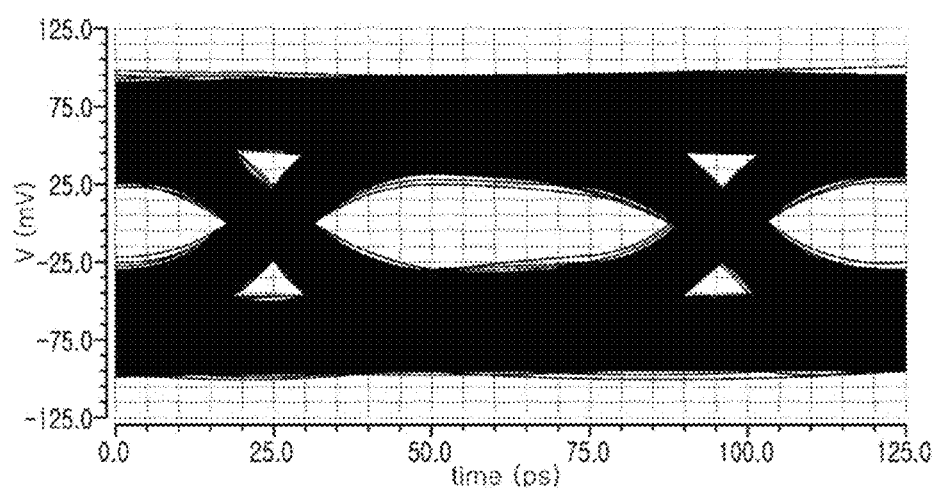
FIG. 6 is a diagram illustrating an eye pattern of a signal recovered by receiving an RF signal having a minimum phase error.
Figure 7:
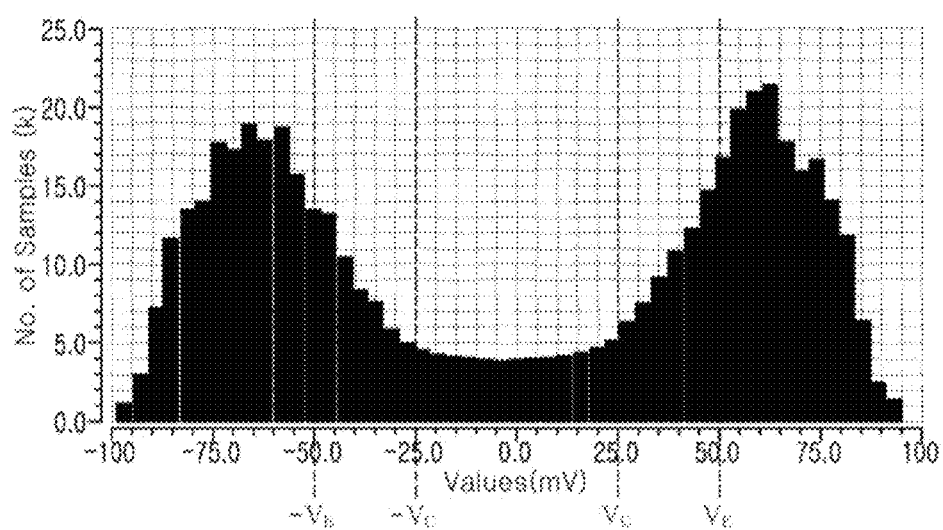
FIG. 7 is a diagram illustrating a histogram function which is generated based on the signal recovered by receiving the RF signal having the minimum phase error.

FIG. 6 is a diagram illustrating an eye pattern of a signal recovered by receiving an RF signal when the phase offset value is minimum, and FIG. 7 is a diagram illustrating the histogram function which is generated based on the signal recovered by receiving the RF signal when the phase offset value is minimum. Further, FIG. 8 is a diagram illustrating an eye pattern of a signal recovered by receiving an RF signal when the phase offset value is maximum, and FIG. 9 is a diagram illustrating a histogram function which is generated based on the signal recovered by receiving the RF signal when the phase offset value is maximum.

For reference, the eye pattern refers to a waveform illustrating by overlapping the level shift flow of a specific signal on one screen within a specific time unit. This overlapped waveform resembles the human eye and thus is called the eye pattern, and the vertically and horizontally open areas of the central portion where signals do not intersect are referred to as eye openings.

As noise is increased in the signal to be measured due to the influence of the phase error or the like, the eye opening is smaller, and conversely, as the noise is decreased and thus the intensity of the signal is better, the eye opening is larger. A clock timing and a reference voltage of the level threshold are determined based on the eye opening, and as the eye opening is larger and cleaner, the bit error rate (BER) of the signal is better.

Figure 8:
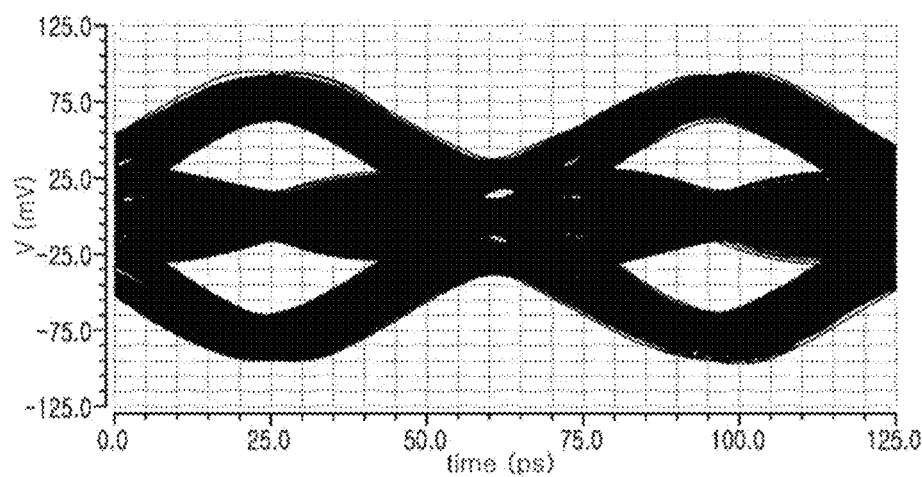
FIG. 8 is a diagram illustrating an eye pattern of a signal recovered by receiving an RF signal having a maximum phase error.
Figure 9:
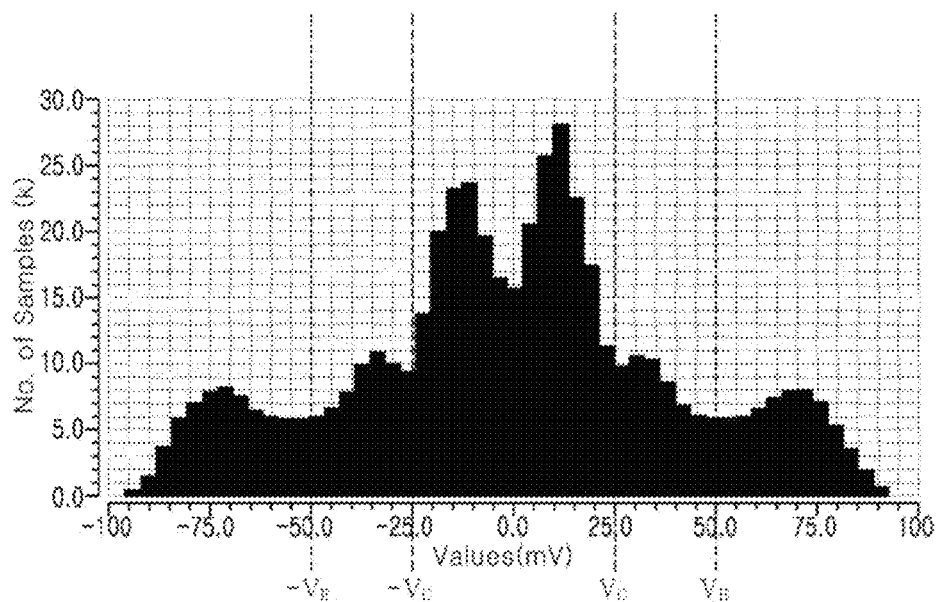
FIG. 9 is a diagram illustrating a histogram function which is generated based on the signal recovered by receiving the RF signal having the maximum phase error.

The eye opening of the signal recovered based on the RF signal with the minimum phase offset value due to the phase error (see FIG. 6) is larger in size than the eye opening of the signal with the maximum phase offset value due to the phase error (FIG. 8).

FIG. 7 illustrates a histogram function which is generated by sampling the signal recovered based on the RF signal with the minimum phase offset value due to the phase error as illustrated in FIG. 6 using the sampling unit 310, and differentiating the cumulative distribution function which is generated using the accumulation unit 312. Further, FIG. 9 illustrates a histogram function which is generated by sampling the signal recovered based on the RF signal with the maximum phase offset value due to the phase error as illustrated in FIG. 8 using the sampling unit 310, and differentiating the cumulative distribution function which is generated using the accumulation unit 312.

It may be confirmed that in the histogram based on the RF signal with the minimum phase offset value due to the phase error (FIG. 7), the integral value between the first center boundary voltage value ($-V_C$) and the second center boundary voltage value ($V_C$) is relatively smaller than the integral value of an area after the edge boundary voltage value ($V_E$).

On the other hand, it may be confirmed that in the histogram based on the RF signal with the maximum phase offset value due to the phase error (FIG. 9), the integral value between the first central boundary voltage value ($-V_C$) and the second central boundary voltage value ($V_C$) is relatively larger than the integral value of an area after the edge boundary voltage value ($V_E$).

Due to such a difference, the cost value of the signal recovered based on the RF signal with the minimum phase offset value due to the phase error (is smaller than the cost value of the signal recovered based on the RF signal with the maximum phase offset value due to the phase error.

Figure 10:
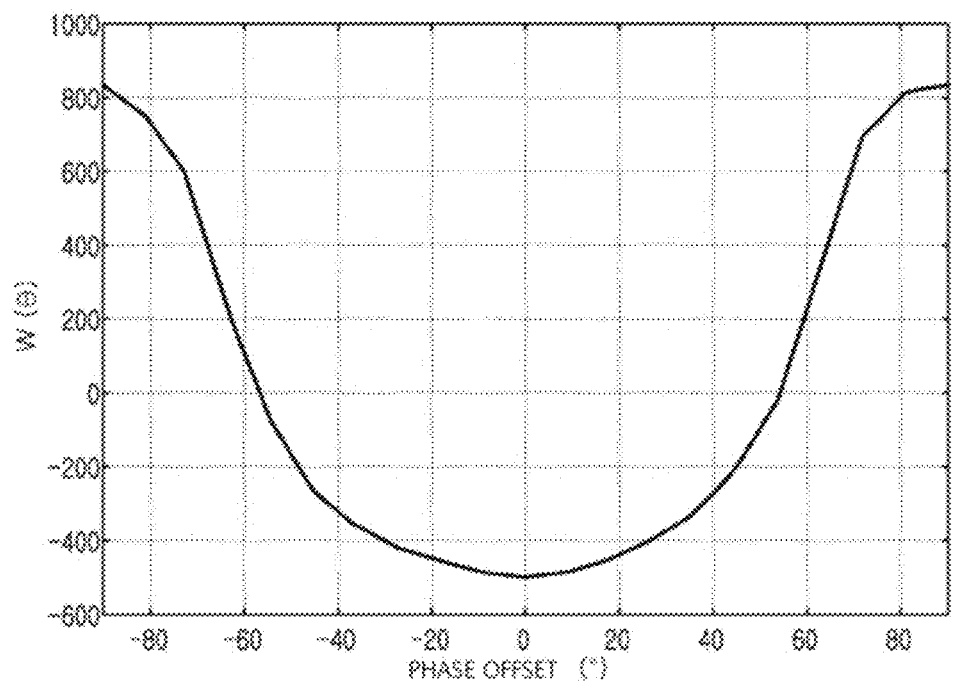
FIG. 10 is a graph illustrating a change in a cost value according to the phase error.

The relationship between the phase offset value and the cost value is summarized in FIG. 10. FIG. 10 is a graph illustrating a change in a cost value according to a phase offset value. As illustrated in FIG. 10, the cost value according to the present disclosure represents the minimum value when the phase offset value is the minimum value, that is, 0, and represents the maximum value when the phase offset value is the maximum value ($-\pi/2$, $\pi/2$).

Accordingly, the phase shift control unit 314 according to the present disclosure compares the cost value calculated based on the histogram for the signal D recovered by the oscillation signal to which the current phase offset value ($\theta$) is applied with the previously calculated cost value, and determines the current phase offset value ($\theta$) corresponding to the cost value with the minimum value as the optimal phase offset value as the comparison result.

Even after the optimal phase offset value is determined, the phase shift control unit 314 may periodically perform the aforementioned process of calculating the cost value and determining the optimal phase offset value according to the calculated result while changing the current phase offset value ($\theta$) according to a predetermined cycle.

In an exemplary embodiment of the present disclosure, the phase shift control unit 314 may determine the optimal phase offset value while changing the current phase offset value ($\theta$) in a brute force, that is, randomly. In another exemplary embodiment, the phase shift control unit 314 may also change the current phase offset value in the manner of increasing or decreasing the current phase offset value ($\theta$) by a predetermined interval (for example, 5°, 10°, or the like) based on the optimal phase offset value.

Referring back to FIG. 3, the phase shift unit 316 shifts the phase of the oscillation signal which is output by the voltage controlled oscillator 318 according to the optimal phase offset value determined by the phase shift control unit 314. As described above, even after the optimal phase offset value is determined, the phase shift control unit 314 may periodically change the phase offset value ($\theta$), and the phase shift unit 316 may adjust the phase of the oscillation signal according to the current phase offset value ($\theta$) which is changed by the phase shift control unit 314.

The mixer 304 converts the frequency of the RF signal amplified by the low noise amplifier 302 using the oscillation signal with the phase whose phase is adjusted by the optimal phase offset by the phase shift unit 316 as described above to output the recovered signal D. As described above, the final signal S in which the recovered signal D is output by the oscillation signal whose phase is adjusted by the optimal phase offset through the buffers 306, 308 is minimally influenced by the phase error included in the RF signal received through the antenna ANT.

Figure 11:
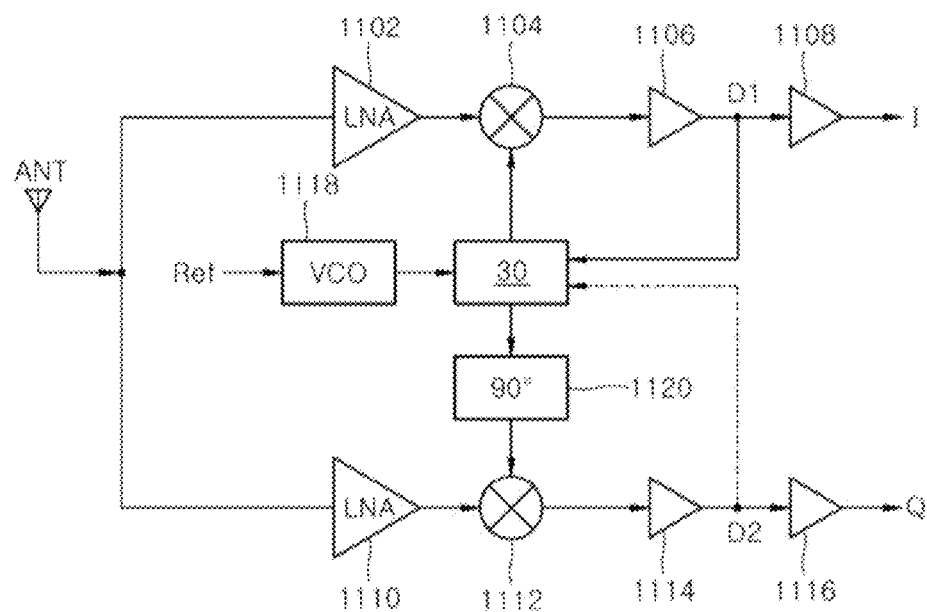
FIG. 11 is a block diagram schematically illustrating a configuration of a receiver including a phase synchronization device according to another exemplary embodiment of the present disclosure.

FIG. 11 is a block diagram schematically illustrating a configuration of a receiver including a phase synchronization device according to another exemplary embodiment of the present disclosure.

The phase synchronization device 30 according to the present disclosure may also be applied to a receiver which restores a signal by a modulation method using a quadrature phase signal which is described above with reference to FIG. 1. As illustrated in FIG. 11, the phase synchronization device 30 according to the present disclosure may determine the optimal phase offset value based on a first recovered signal D1 in which an RF signal received through the antenna ANT is output through a first low noise amplifier 1102, a first mixer 1104, and a first buffer 1106.

That is, the phase synchronization device 30 may determine an optimal phase offset value based on the cost value by performing a sampling based on the first recovered signal D1, generating a histogram function according to the sampling result, and calculating the aforementioned cost value based on the generated histogram function.

The phase synchronization device 30 adjusts the phase of the oscillation signal supplied from the voltage controlled oscillator 1118 based on the determined optimal phase offset value, and supplies the phase-adjusted oscillation signal to the first mixer 1104 and a phase shift unit 1120, respectively. The phase shift unit 1120 adjusts the phase of the phase-adjusted oscillation signal by 90 degrees again to supply the phase-adjusted signal to the second mixer 1112. Through such a process, the I signal and the Q signal, in which phase errors included in the RF signal received through the antenna ANT are compensated, are obtained.

FIG. 11 illustrates an exemplary embodiment in which the phase synchronization device 30 determines the optimal phase offset value based on the first recovered signal D1, but according to an exemplary embodiment, the phase synchronization device 30 may also determine the optimal phase offset value based on a second recovered signal D2 which is output through a second low noise amplifier 1110, a second mixer 1112, and a second buffer 1114.

In still another exemplary embodiment, the phase synchronization device 30 may also determine the optimal phase offset value using both the first recovered signal D1 and the second recovered signal D2. In this case, the phase synchronization device 30 calculates a minimum value of a value obtained by adding a cost value calculated based on the first recovered signal D1 and a cost value calculated based on the second recovered signal D2, and determines the current phase offset value corresponding to the minimum value as the optimal phase offset value.

The receiver to which the phase synchronization device 30 according to the present disclosure described so far is applied does not use the module such as the ADC or the DSP used in the receiver according to the related art to compensate for the phase error, thereby consuming less power and easily designing the receiver. Particularly, if the RF signal modulated in the BPSK method is demodulated using the receiver having the configuration illustrated in FIG. 11, there is an advantage in that the separate quadrature phase signal is not required to compensate for the phase error as in the related art.

Figure 2:
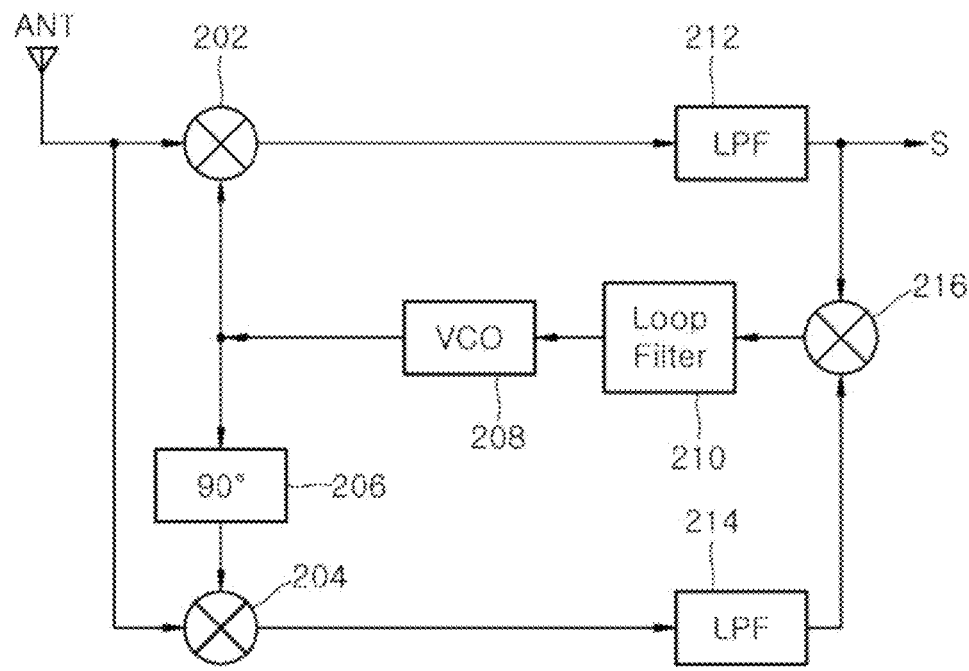
FIG. 2 is a block diagram schematically illustrating a configuration of another receiver used in the RF communication system according to the related art.

Further, the receiver to which the phase synchronization device 30 according to the present disclosure is applied is more easily designed even when compared with the conventional receiver illustrated in FIG. 2, and does not require the separate quadrature phase signal for compensating for the phase error.

Particularly, the phase synchronization device according to the present disclosure has an advantage in that the phase synchronization device may be implemented as a module having a small volume or area while consuming less power such as a complementary metal-oxide semiconductor (CMOS).

Figure 12:
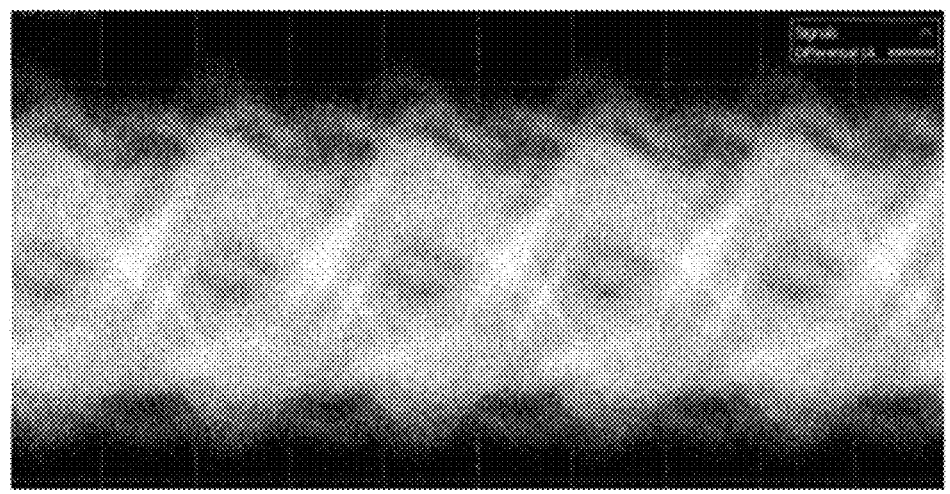
FIG. 12 is a diagram illustrating an eye pattern of a signal recovered by a receiver which does not include the phase synchronization device according to the present disclosure.

FIG. 12 is a diagram illustrating an eye pattern of a signal recovered by a receiver which does not include the phase synchronization device according to the present disclosure. Further, FIG. 13 is a diagram illustrating an eye pattern of a signal recovered by a receiver including the phase synchronization device according to the present disclosure.

Figure 13:
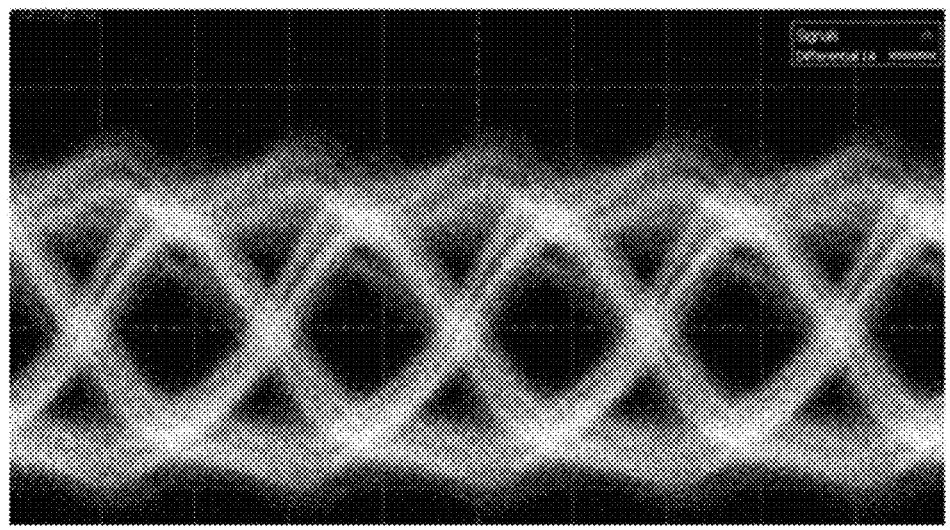
FIG. 13 is a diagram illustrating an eye pattern of a signal recovered by a receiver which includes the phase synchronization device according to the present disclosure.

As illustrated in FIGS. 12 and 13, the size of the eye opening of the signal recovered by the receiver which does not include the phase synchronization device according to the present disclosure is smaller than that of the eye opening of the signal recovered by the receiver which includes the phase synchronization device according to the present disclosure. This means that the recovered signal with higher quality may be obtained in the case of using the receiver to which the phase synchronization device according to the present disclosure is applied as compared to a case of using the receiver to which the phase synchronization device according to the present disclosure is not applied.

Since the aforementioned present disclosure may be variously substituted, modified, and changed by those skilled in the art to which the present disclosure pertains without departing from the technical spirit of the present disclosure, the present disclosure is not limited by the aforementioned exemplary embodiments and the accompanying drawings.

The invention claimed is:

1. A phase synchronization device comprising:
a sampling unit for outputting a sampling value by sampling a recovered signal based on a predetermined threshold voltage value;
a phase shift control unit for calculating a cost value for the recovered signal using a histogram function generated based on the sampling value, and for determining an optimal phase offset value based on the cost value; and
a phase shift unit for shifting the phase of an oscillation signal according to the optimal phase offset value;
wherein the phase shift control unit determines the current phase offset value as the optimal phase offset value when the cost value calculated based on the current phase offset value applied to the recovered signal is a minimum value as compared with cost values calculated for previous phase offset values.

2. The phase synchronization device of claim 1, wherein the sampling unit samples the recovered signal while changing the threshold voltage value from a predetermined minimum threshold voltage value to a predetermined maximum threshold voltage value.

3. The phase synchronization device of claim 1, further comprising an accumulation unit for accumulating the number of outputs of the sampling value to generate a cumulative distribution function for the recovered signal, wherein the histogram is generated based on the cumulative distribution function.

4. The phase synchronization device of claim 3, wherein the accumulation unit accumulates the number of outputs of a predetermined cumulative target sampling value among the sampling values to generate the cumulative distribution function.

5. The phase synchronization device of claim 3, wherein the histogram function is generated by differentiating the cumulative distribution function.

6. The phase synchronization device of claim 5, wherein the phase shift control unit calculates the cost value using Equation 1 below:

$$W(\theta) = \int_{-V_C}^{V_C} \frac{\partial H(v,\theta)}{\partial v} \partial v - \alpha \int_{V_E}^{\infty} H(v,\theta) \partial v - \beta \int_{-\infty}^{V_E} H(v,\theta) \quad \text{Equation 1}$$

(where W refers to the cost value, $\theta$ refers to a current phase offset value applied to the recovered signal, $-V_C$ refers to a first center boundary voltage value, $V_C$ refers to a second center boundary voltage value, $-V_E$ refers to a first edge boundary voltage value, $V_E$ refers to a second edge boundary voltage value, $\alpha$ and $\beta$ refer to predetermined constants, and H refers to the histogram function).

7. The phase synchronization device of claim 1, wherein the phase shift control unit calculates the cost value based on the histogram function and a predetermined boundary voltage value.

8. The phase synchronization device of claim 1, wherein the phase shift control unit determines the optimal phase offset value while changing the current phase offset value according to a predetermined cycle.

9. The phase synchronization device of claim 1, wherein the recovered signal comprises at least one of an I signal and a Q signal.

* * * * *